US009748306B2

United States Patent
Morgan

(10) Patent No.: US 9,748,306 B2
(45) Date of Patent: Aug. 29, 2017

(54) RADIATION DETECTORS, AND METHODS OF MANUFACTURE OF RADIATION DETECTORS

(71) Applicant: BAE SYSTEMS plc, London (GB)

(72) Inventor: Russell Alan Morgan, Waterlooville (GB)

(73) Assignee: BAE SYSTEMS plc, London (GB)

( * ) Notice: Subject to any disclaimer, the term of this patent is extended or adjusted under 35 U.S.C. 154(b) by 0 days.

(21) Appl. No.: 14/443,565

(22) PCT Filed: Nov. 15, 2013

(86) PCT No.: PCT/GB2013/053021
§ 371 (c)(1),
(2) Date: May 18, 2015

(87) PCT Pub. No.: WO2014/076492
PCT Pub. Date: May 22, 2014

(65) Prior Publication Data
US 2015/0295008 A1    Oct. 15, 2015

(30) Foreign Application Priority Data

Nov. 19, 2012  (EP) .................................... 12275176
Nov. 19, 2012  (GB) .................................. 1220767.6

(51) Int. Cl.
*H01L 27/146*    (2006.01)
*G01T 1/16*    (2006.01)
(Continued)

(52) U.S. Cl.
CPC .......... *H01L 27/14658* (2013.01); *G01T 1/16* (2013.01); *H01L 27/1463* (2013.01);
(Continued)

(58) Field of Classification Search
CPC .. G01T 1/18; G01T 3/008; G01T 1/16; H01L 27/14658; H01L 27/1463; H01L 27/14683;
(Continued)

(56) References Cited

U.S. PATENT DOCUMENTS 6,306,772 B1 * 10/2001 Lin ..................... H01L 21/3065
257/E21.218
2006/0255287 A1   11/2006 Cholewa et al.
(Continued)

FOREIGN PATENT DOCUMENTS

| EP | 1967869 A1 | 9/2008 |
|---|---|---|
| WO | 2010011859 A2 | 1/2010 |
| WO | 2014076492 A1 | 5/2014 |

OTHER PUBLICATIONS

International Search Report received for Patent Application No. PCT/GB2013/053021, mailed on Apr. 22, 2014. 7 pages.
(Continued)

*Primary Examiner* — Trung Q Dang
*Assistant Examiner* — Patricia Reddington
(74) *Attorney, Agent, or Firm* — Finch & Maloney PLLC

(57) ABSTRACT

Radiation detectors are disclosed. The radiation detectors comprise a substrate and at least one radiation sensitive region on the substrate, the at least one radiation sensitive region comprising an array of elongate nanostructures projecting from the substrate. Methods of manufacture of such radiation detectors are also disclosed.

10 Claims, 8 Drawing Sheets

(51) Int. Cl.
*H01L 31/028* (2006.01)
*H01L 31/0352* (2006.01)
*H01L 31/08* (2006.01)
*H01L 31/18* (2006.01)

(52) U.S. Cl.
CPC ...... *H01L 27/14683* (2013.01); *H01L 31/028* (2013.01); *H01L 31/0352* (2013.01); *H01L 31/085* (2013.01); *H01L 31/1808* (2013.01)

(58) Field of Classification Search
CPC . H01L 31/028; H01L 31/0352; H01L 31/085; H01L 31/1808
USPC .............................................. 257/428; 438/57
See application file for complete search history.

(56) References Cited

U.S. PATENT DOCUMENTS

| | | | |
|---|---|---|---|
| 2008/0110486 A1 | 5/2008 | Tsakalakos et al. | |
| 2009/0121136 A1* | 5/2009 | Gruss | G01J 5/02 250/336.1 |
| 2011/0003279 A1* | 1/2011 | Patel | G01D 7/005 435/5 |
| 2011/0266521 A1* | 11/2011 | Ferrari | B82Y 30/00 257/14 |
| 2011/0299074 A1* | 12/2011 | Kim | B82Y 10/00 356/326 |
| 2012/0049054 A1 | 3/2012 | Zhou et al. | |
| 2012/0083128 A1* | 4/2012 | Hung | H01L 21/3065 438/711 |
| 2012/0241632 A1* | 9/2012 | Cordaro | G01T 1/18 250/370.01 |
| 2012/0322164 A1* | 12/2012 | Lal | B82Y 10/00 436/501 |

OTHER PUBLICATIONS

GB Intellectual Property Office Search Report under Section 17(5) received for GB Patent Application No. 1220767.6. Mar. 22, 2013. 5 pages.
Extended European Search Report received for EP Patent Application No. 12275176.1. Mailed Aug. 2, 2013. 12 pages.
Partial European Search Report received for EP Patent Application No. 12275176.1. Mailed Apr. 16, 2013. 8 pages.
Ambrosio, et al., "A novel photon detector made of silicon and carbon nanotubes," Nuclear Instruments and Methods in Physics Research, Section A (2010). vol. 617, pp. 378-380.
Bellinger, et al., "Improved High Efficiency Stacked Microstructured Neutron Detectors Backfilled With Nanparticle 6LiF," IEEE Transactions on Nuclear Science, vol. 59, No. 1, Feb., 2012, pp. 167-173.
International Preliminary Report on Patentability and Written Opinion received for Patent Application No. PCT/GB2013/053021, mailed on May 28, 2015. 11 pages.
International Preliminary Report on Patentability and Written Opinion received for Patent Application No. PCT/GB2013/053021, dated May 28, 2015. 11 pages.

* cited by examiner

RADIATION DETECTORS, AND METHODS OF MANUFACTURE OF RADIATION DETECTORS

The present invention relates to radiation detectors, and to methods of manufacture thereof. The present invention relates in particular to radiation detection incorporating elongate nanostructures intended for use in the detection of x-ray and gamma radiation.

Reducing the physical size of a conductor or semiconductor can result in changes to the electronic band structure of the material, and can further result in changes to the manner in which electric charge is transported within the material. In this specification, the term 'nanostructures' is intended to mean structures whose size, in at least one dimension, is sufficiently small to result in significant changes to the electronic properties of the structure in comparison to the bulk material. Such effects are known to be observable in structures having at least one dimension smaller than 100 nm. Accordingly, 'nanostructures' are typically of a size less than approximately 100 nm in at least one dimension, and elongate nanostructures are rod-like structures whose size in two dimensions is less than approximately 100 nm, with a size in the third dimension that is significantly greater.

A variety of solid state radiation detectors are known, using a number of different semiconductor materials as the sensing material. Solid state radiation detectors operate, in broad terms, on the same principles. An incident radiation particle or wave interacts within the sensing semiconductor to create one or more electron-hole pairs, which will separate under the influence of an applied electric field. This results in an electric signal that can be amplified and recorded using suitable, known, electronics. The size of the signal is dependent on the number of electron-hole pairs generated, which in turn is dependent on the energy of the incident particle. Thus, it can be possible to measure the energy of the incident particle, if the particle is stopped within the sensing material.

Relevant properties to consider when selecting a material to form the sensing material of a radiation detector include the band gap, its charge transport properties including the electron mobility and the mobility-lifetime product, the rate of electron-hole pair production, and the cross-section for interaction with incident radiation. The band gap determines the type of radiation that will be detected, since radiation particles of energy lower than the band gap will be unable to generate electron-hole pairs; conversely, if the band gap is too low, the detector will suffer from excessive noise arising from detection of background radiation or thermal effects. Good charge transport properties are essential if the signal is to be detected, rather than the generated electron-hole pairs recombining within the sensing material. It is clearly important that the cross-section for interaction with the relevant radiation is high, or the volume of sensing material required for efficient detection will be too great, and it becomes less likely that an incident particle will be stopped in the sensing material. In addition, for practical application, the cost of suitably high quality material is also important.

A common material used for the detection of x-ray and gamma photons is cadmium telluride, alloyed with a small amount of zinc. In order to be position sensitive, detectors need to be pixelated. For current detectors based on cadmium telluride, this requires processing on both sides of a CdTe slab, necessarily including a 'flip-chip' step, in which alignment to a tolerance of 1 μm is critical. In addition, individual solder connections must be made to each pixel, prior to the flip-chip process, using a technique known as the bump process flow. In addition to the critical alignment necessary as part of the flip-chip process, both these processes are time consuming. Germanium can also be used as a sensing material for x-ray and gamma photons, but, because of its relatively low band gap of 0.66 eV, noise becomes significant at room temperature, such that detectors using bulk germanium must be cooled in liquid nitrogen for effective operation, limiting their portability. By way of contrast, the band gap of CdTe is 1.44 eV.

It is an aim of the present invention to overcome, or at least mitigate, at least some of the above-identified problems associated with prior-known radiation detectors.

In accordance with a first aspect of the present invention, there is provided a radiation detector comprising a substrate and at least one radiation sensitive region on the substrate, the at least one radiation sensitive region comprising an array of elongate nanostructures projecting from the substrate.

The material from which the elongate nanostructures are fabricated, and the dimensions of the elongate nanostructures, may be selected such that the bandgap of the elongate nanostructures is suitable for the room temperature detection of x-ray and gamma radiation. The elongate nanostructures may be formed of germanium.

The elongate nanostructures may have a cross-sectional area in the range between approximately 500 square nanometers and approximately 5000 square nanometers.

The bandgap of the elongate nanostructures may be between approximately 0.9 eV and approximately 1.1 eV. Such a band gap is suitable for the detection of x-ray and gamma photons.

The detector may comprise an array of radiation sensitive regions, wherein each radiation sensitive region is configured to function as a pixel of the radiation detector.

The detector may further comprise a filler material arranged in the gaps between the elongate nanostructures and selected to mutually isolate the elongate nanostructures. The filler material may further enhance the mechanical robustness of the detector.

The filler material may be selected from the group consisting of silicon and silicon dioxide. Where silicon is used as the filler material, it is preferable to form a coating of silicon dioxide around the side walls of the nanostructures to provide additional electrical isolation between adjacent elongate nanostructures.

The radiation detector may be packaged as a handheld device.

In accordance with a second aspect of the present invention, there is provided a method of manufacturing a radiation detector comprising the steps of: (i) providing a layer of a first material on a substrate; (ii) selectively removing the first material from parts of the layer; (iii) filling the removed parts of the layer with a second material; wherein one of the first or the second material comprises germanium, and wherein steps (ii) and (iii) in combination result in an array of elongate nanostructures.

In one exemplary embodiment, described in further detail below, the first material comprises germanium, and the step of selectively removing the first material comprises the steps of: applying a mask material to define the material to be removed from the layer; anisotropically removing material from the layer using a first plasma etching process during which a passivating material is formed on the side walls of the features being etched; subsequent to the first etching process, using a second plasma etching process to deepen the features created by the first etching process, the second etching process anisotropically removing further material from the features etched by the first etching process; wherein the etchant species responsible for the removal of material from the features during the second etching process is collimated by those parts of the features formed by the first etching process, such that no further passivation is required during the second etching process. The second material may be silicon dioxide.

The first and second etching processes may be inductively coupled plasma reactive ion etching processes. The process gas used for the first etching process may be a combination of hydrogen bromide, helium and oxygen; and the process gas used for the second etching process may be nitrogen fluoride.

In an alternative embodiment, the first material may be silicon dioxide, and the second material may be germanium.

The substrate may comprise a pixelated CMOS ASIC wafer, and the method may further comprise the step of forming an electrode on the exposed surface of the structure after the step of filling the removed parts of the layer with a second material.

According to a third aspect of the invention, there is provided a method of manufacturing a radiation detector comprising the steps of: (i) providing a layer of germanium on a substrate; (ii) selectively removing the first material from parts of the layer to define an array of elongate nanostructures; (iii) filling the removed parts of the layer with a second material; wherein the step of selectively removing the first material comprises the steps of: applying a mask material to define the material to be removed from the layer; anisotropically removing material from the layer using a first plasma etching process during which a passivating material is formed on the side walls of the features being etched; and, subsequent to the first etching process, using a second plasma etching process to deepen the features created by the first etching process, the second etching process anisotropically removing further material from the features etched by the first etching process; wherein the etchant species responsible for the removal of material from the features during the second etching process is collimated by those parts of the features formed by the first etching process, such that no further passivation is required during the second etching process.

In accordance with a fourth aspect of the invention, there is provided a method of machining deep high aspect ratio features in a substrate, comprising the steps of: applying a mask material to define the material to be removed; anisotropically removing material from the substrate using a first plasma etching process, during which a passivating material is formed on the side walls of the features being etched; subsequently, using a second plasma etching process to deepen the features created by the first etching process; wherein the etchant species responsible for the removal of material from the features during the second etching process is collimated by those parts of the features formed by the first etching process, such that no further passivation is required during the second etching process The above and further features of the invention are set forth with particularity in the appended claims and will be described hereinafter with reference to the accompanying drawings in which:

Figure 1:
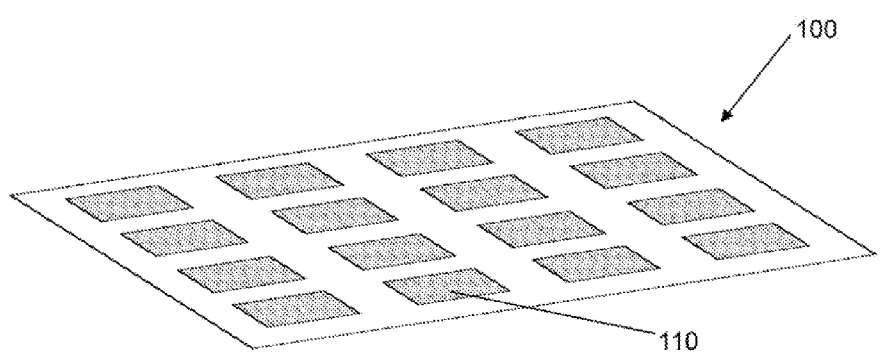
FIG. 1 is schematic diagram illustrating the active part of a radiation detector in accordance with a first embodiment of the present invention.

FIG. 1 is a schematic illustration of the active part of a solid state radiation detector 100 in accordance with a first embodiment of the present invention. Radiation detector 100, as illustrated, includes sixteen radiation-sensitive regions 110. These regions 110 are sensitive to incident radiation, producing an electric signal when, during operation of the radiation detector, an incident radiation particle or photon interacts within the radiation-sensitive region, as explained in further detail below. It will be appreciated that, in practice, it is likely that the radiation detectors may have many more such regions, each of which is able to function as one pixel of the radiation detector 100. Providing the radiation detector 100 with a large number of radiation sensitive regions 110, or pixels, provides the radiation detector 100 with some sensitivity to the position at which a radiation particle or photon strikes the detector.

Figure 2:
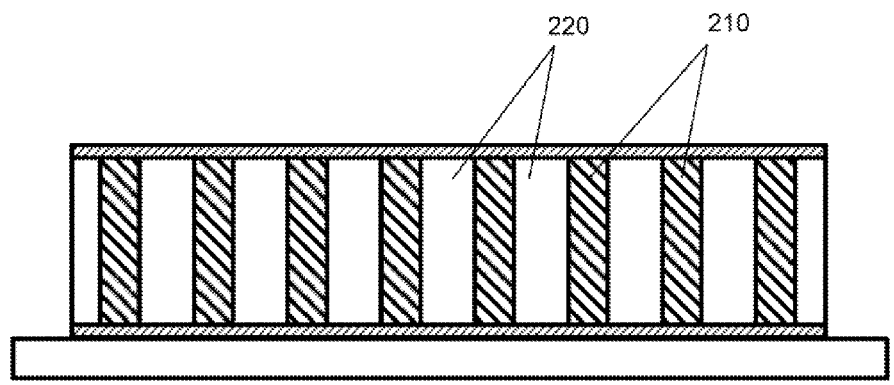
FIG. 2 is an enlarged cross-sectional view of a part of a radiation sensitive region on the active part of the radiation detector illustrated in FIG. 1.

Each active region 110 includes a number of elongate nanostructures projecting perpendicularly from the substrate material. The elongate nanostructures 210 are more clearly illustrated in FIG. 2, which is a cross-sectional view through a part of one of the radiation sensitive regions 110 illustrated in FIG. 1. Each radiation sensitive region may comprise many more elongate nanostructures than are shown in FIG. 2, possibly of order one million such elongate nanostructures. In the present embodiment, each elongate nanostructure is formed from germanium. Between the nanostructures is a filler material 220 which, in the present embodiment, is silicon dioxide. The filler material 220 limits charge transport between the different nanostructures. It is therefore beneficial to ensure that the material selected for the filler material has insulating properties at room temperature. In other embodiments, it may be possible to use silicon as a filler material, but provide a barrier layer of silicon dioxide around each nanostructure 210 in order to limit charge transport between individual nanostructures which might otherwise be facilitated by silicon at room temperature. Metallic contacts are provided at either side of the radiation sensitive region to enable the application of an electric field to the radiation sensitive region. Referring again to FIG. 1, a single contact can be provided for the lower, substrate side of the elongate nanostructures, whilst one contact is provided for each of the radiation sensitive regions 110.

Radiation detector 100 works in a similar manner to other solid state radiation detectors. When a photon, or other radiation particle is incident upon the radiation detector 100, it may interact within the radiation sensitive region. Such interactions may result in the creation of an electron-hole pair, which will separate under the influence of an applied electric field, generating an electric signal that can be amplified and recorded using appropriate electronics connected to the radiation detector.

The materials of the radiation sensitive region are chosen partly such that the photon has a high likelihood of interacting within the elongate nanostructures. The cross-section for the interaction of photons with a material increases rapidly with increasing atomic number Z. In the present embodiment, the nanostructures are formed from germanium (Z=32), which has a significantly higher atomic number than the filler material silicon (Z=14). A number of other factors also influence the selection of germanium as the material for the radiation sensitive material. Firstly, germanium has excellent charge transport properties: its electron mobility (3900 $cm^2$/V/s) is more than double that of silicon (1600 $cm^2$/V/s), and the mobility lifetime product is also relatively high. Secondly, it is relatively cheap: semiconductor-grade germanium currently costs approximately 3 pence per cubic millimeter, whereas semiconductor grade cadmium telluride (CdTe), commonly used for the detection of x-ray and gamma radiation, costs approximately 30 pence per cubic millimeter. Germanium is also in good supply, whereas the supply of tellurium is less well-known, and furthermore germanium is also easily integrated into wafer scale semiconductor fabrication techniques, facilitating the manufacture of germanium-based radiation detectors.

Germanium is not typically used for radiation detectors because of its relatively narrow band gap (in bulk form) of 0.66 eV. The radiation detector 100 overcomes this problem through the use of germanium nanorods. As a result of the small cross-section of the nanorods, charge carriers are effectively confined to motion along one dimension, resulting in the raising of the band gap to approximately 1.00 eV. Radiation detector 100 can, as a result of the broader band gap of the germanium nanorods, be used at room temperature.

A method of fabrication of the radiation detector 100 will now be described with reference to FIGS. 3a to 3h. Fabrication begins from a commercially available pixelated CMOS ASIC multiplex wafer, a part 300 of which is shown in cross-section in FIG. 3a. Such wafers can be obtained from suppliers such as Austria MicroSystems (AMS, of Graz, Austria), or X-Fab of Erfurt, Germany. Wafer 300 comprises a silicon substrate 310, an interlayer dielectric 320, an aluminium interconnect layer 330, a passivation layer 340 and a pixel 350.

The portion of the wafer 300 shown has only one pixel 350, but it will be understood that the wafer 300 may comprise several thousand such pixels. Separate connections to each such pixel are possible through the aluminium interconnect layer, which is capacitively coupled to each individual pixel through the interlayer dielectric. The pixel 350 is formed from aluminium deposited onto the interlayer dielectric, to a thickness of approximately 500 nm. The surface of aluminium as formed on the dielectric is not stable, and so, as standard for such commercially available wafers, the surface of the pixel 350 is zincated and then coated with nickel by electro-less deposition. This pixel area forms a first, lower electrode for the radiation detector fabricated by the process. Passivation layer 340 is formed from silicon dioxide in the present embodiment, although it will be appreciated that other materials, such as silicon nitride, or a combination of silicon dioxide and silicon nitride, could also be used. The function of the passivation layer is to minimise cross-talk between individual pixels on the surface of the wafer.

Figure 3A:
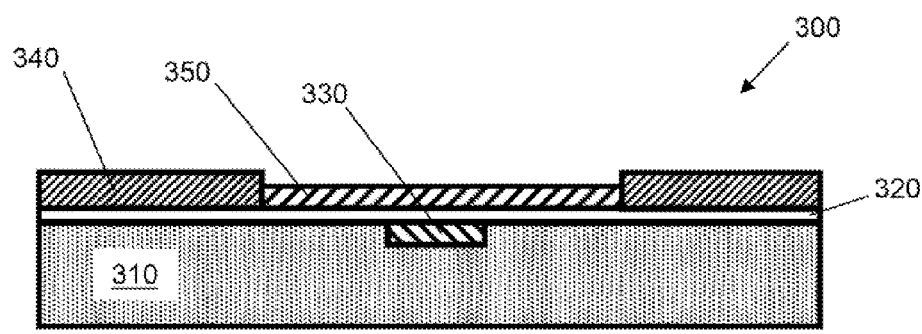
FIGS. 3a to 3h illustrate a series of stages in the manufacture of the radiation detector illustrated in FIG. 1, applying a method in accordance with a second embodiment of the invention.
Figure 3B:
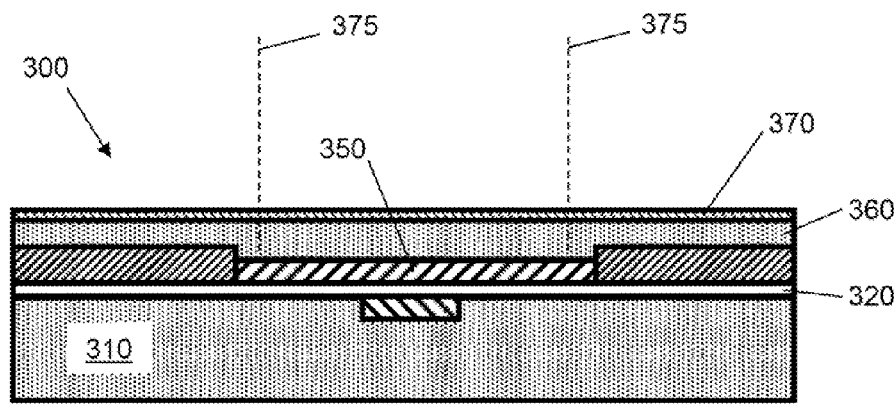

A first step in the fabrication of the radiation detector is the formation of a thick, planarized layer of silicon dioxide on the surface of the wafer, followed by the deposition of a suitable mask material. The result of this first step for a similar portion of the wafer 300 as illustrated in FIG. 3a is shown in FIG. 3b, again in cross-section. In FIG. 3b, and throughout FIGS. 3b to 3h, like reference numerals are used to illustrate like parts in the successive stages of fabrication of the radiation detector. Layer 360 of silicon dioxide is deposited by low temperature, low stress plasma-enhanced chemical vapour deposition, resulting in a layer with a planarized upper surface. By 'planarized', it will be understood that the resulting surface (the upper surface as shown in FIG. 3) of silicon dioxide is flat, most preferably to an atomic degree of flatness. A further thin metal layer 370 is then deposited on the exposed surface of the silicon dioxide. In the present embodiment, layer 370 is formed by sputtering aluminium onto the surface of the silicon dioxide.

Figure 3C:
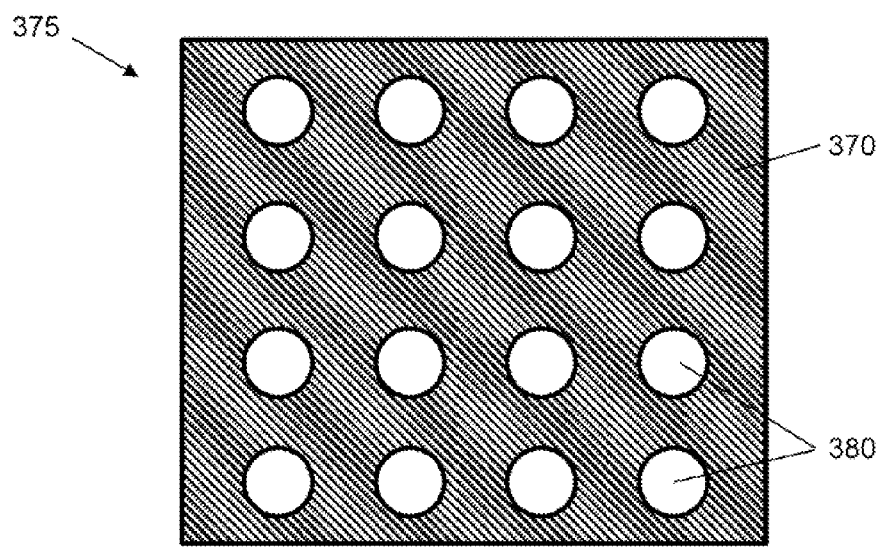

A second step in the fabrication of the radiation detector is the imprinting of the thin metal layer 370 with a pattern to enable etching of the silicon dioxide layer. The pattern is defined in a region defined above the pixel layer 350 and is bounded slightly inside of the edges defined by the boundary between the aluminium 350 and the passivation layer 340, as indicated by the dashed lines 375 in FIG. 3b. FIG. 3c illustrates schematically, in plan view, the pattern imprinted in region 375. The pattern defines an array of small circular holes 380 in the metal layer 370. These holes are, as illustrated, arranged in a square array of five by five. It will be appreciated from the further description below that the regions underneath these holes 380 provide regions into which germanium is deposited in order to form nano-rods. As such, the holes 380 have a diameter of approximately 50 nm, and it will be appreciated that the pattern imprinted may include many more such holes, possibly of order a million such holes. The portions 380 provide a mask for the subsequent etching of the silicon dioxide in region 375.

Figure 3D:
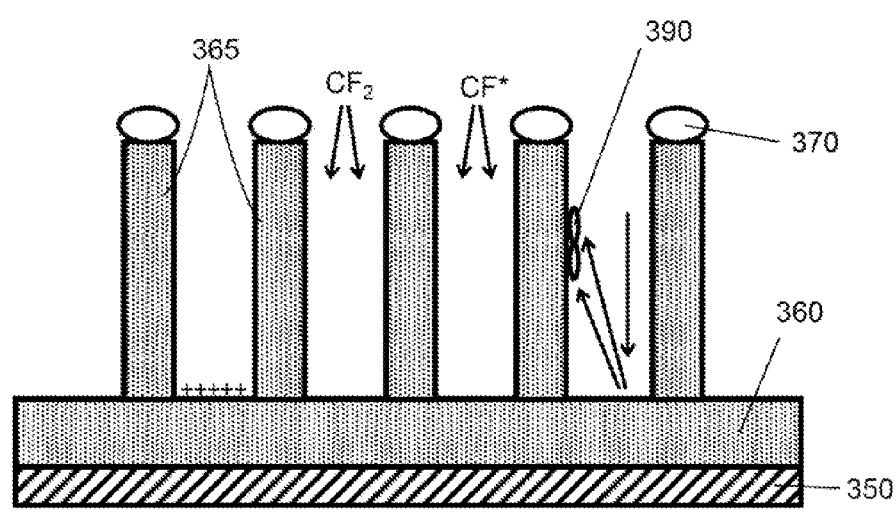
Figure 3E:
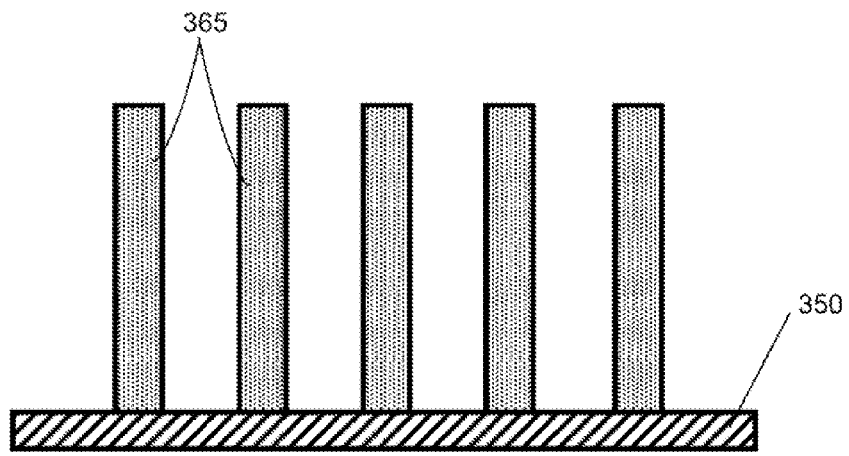

A third step in the fabrication of the radiation detector is the etching of the silicon dioxide layer 360, illustrated in FIGS. 3d. FIG. 3d is a schematic diagram of the etching process forming a number of nanorod-scale features 375 in silicon dioxide. In the method of the present embodiment, silicon dioxide is etched away in the regions left unprotected by the metallic mask layer 370, and those parts etched away are then filled with germanium (as is described in more detail below) to form the germanium nanorods.

Figure 4:
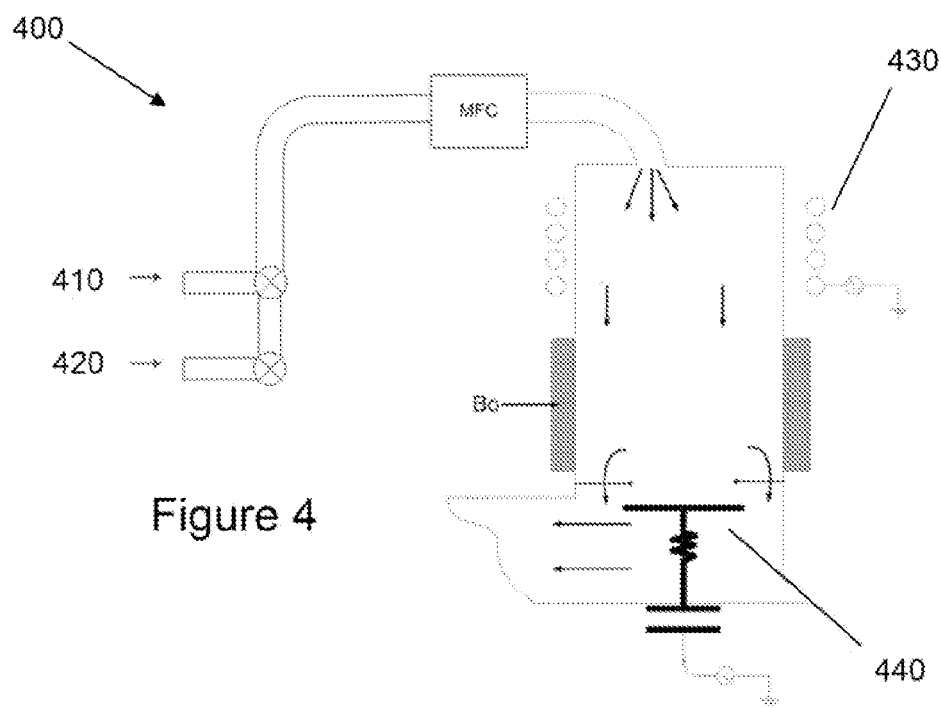
FIG. 4 is a schematic illustration of etching apparatus used in the fabrication of the first embodiment of the invention.

The silicon dioxide is etched using an inductively coupled plasma reactive ion etching process. The process gas supplied to the etching chamber comprises argon and octafluorocyclobutane $C_4F_8$. $C_4F_8$ breaks down under the influence of an applied radio-frequency (RF) field into radical species such as $CF_2$ and CF* which bombard and react with the silicon dioxide to etch away those parts not protected by the mask 370. The apparatus used for the etching process is schematically illustrated in FIG. 4. The gases $C_4F_8$ and Ar are introduced into the system at 410 and 420, at flow rates of 300 sccm for $C_4F_8$ and 40 sccm for Ar. (One standard cubic centimeter per minute, or 1 sccm, is equivalent to the flow of one cubic centimeter of a gas at 0° C. and one atmosphere pressure). A plasma is formed by dissociation of the $C_4F_8$ in the field created by an RF current applied to coil 430, operated at 1800 W (the coil power). The etching is an ion impact process, which results in high anisotropic fidelity. An RF current is also applied to the substrate, and the power of the RF applied to the substrate controls the ion impact energy on the silicon dioxide. The substrate power used is 100 W. The etch products, silicon tetrafluoride and carbon monoxide, that result from interactions of the dissociation products of $C_4F_8$ with the silicon dioxide, are volatile. In order to ensure that these products can escape, particularly from the high aspect ratio features essential for nanorod formation, etching is carried out at a low pressure of approximately 12 mTorr.

The formation of high aspect ratio features is assisted by ensuring that the mask etch rate is very low relative to the etch rate of the silicon dioxide. Selectivity is enhanced by using a low ion impact energy, to avoid sputtering of the mask, and by using a metallic mask (aluminium, in the present embodiment). Selectivity of 800:1 can be achieved using an aluminium mask. Alternatively, although not preferred, photoresist can be used for the mask, in which case a selectivity of 200:1 can be achieved. In addition, the formation of high aspect ratio features is assisted through the formation of a passivation layer on the side walls of the features as they are etched. This passivation layer comprises carbon fluoride compounds which can adhere to the side walls since the ion bombardment is directional, with ions predominantly impacting upon the bottom surface of the etched trenches.

A fourth step in the fabrication of the radiation detector is the removal of the mask from the pixel regions. The result of this fourth step is shown schematically in FIG. 3e, in which the silicon dioxide has been etched completely away in the areas exposed by the masks, uncovering the pixel layer 350 of the ASIC. The mask is removed only from the pixel regions, where the nanorods are located, leaving a covering of metallic material over the remainder of the device. This metallic material forms an upper, common electrode for the radiation sensitive regions of the radiation detector. The features 365 etched in the silicon dioxide are approximately 900 μm deep, 50 nm wide, and separated by approximately 100 nm.

Figure 3F:
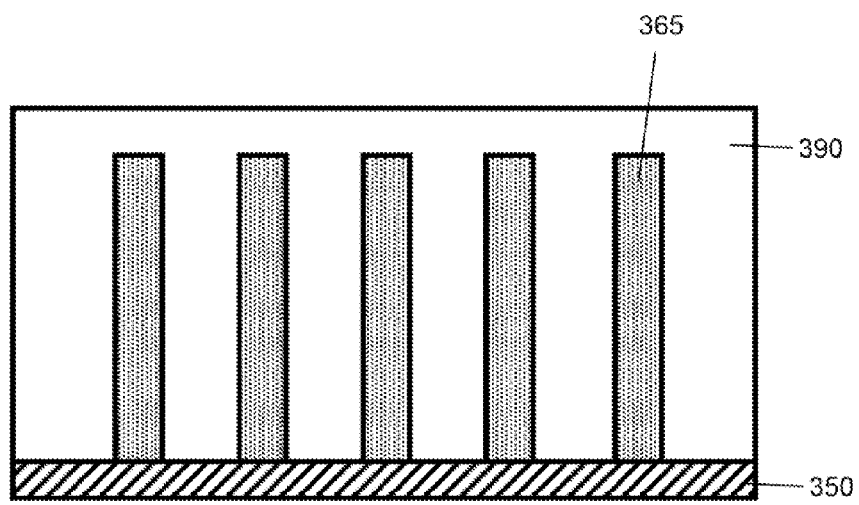
Figure 3G:
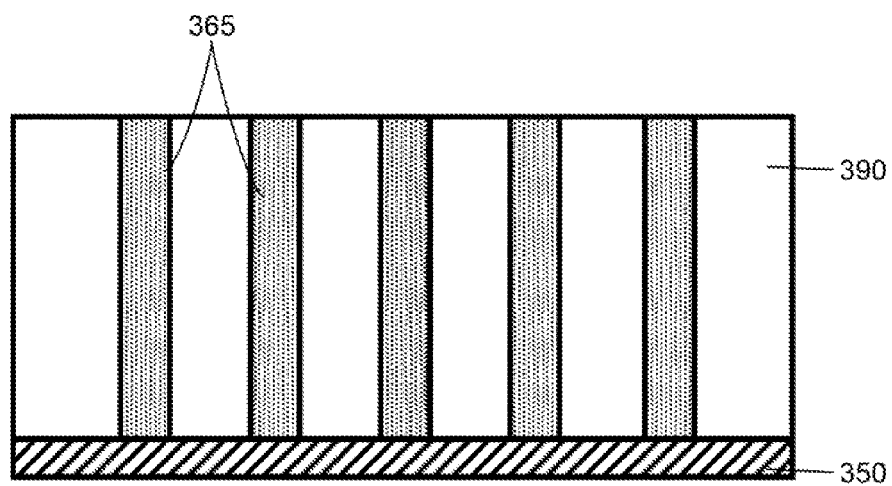
Figure 3H:
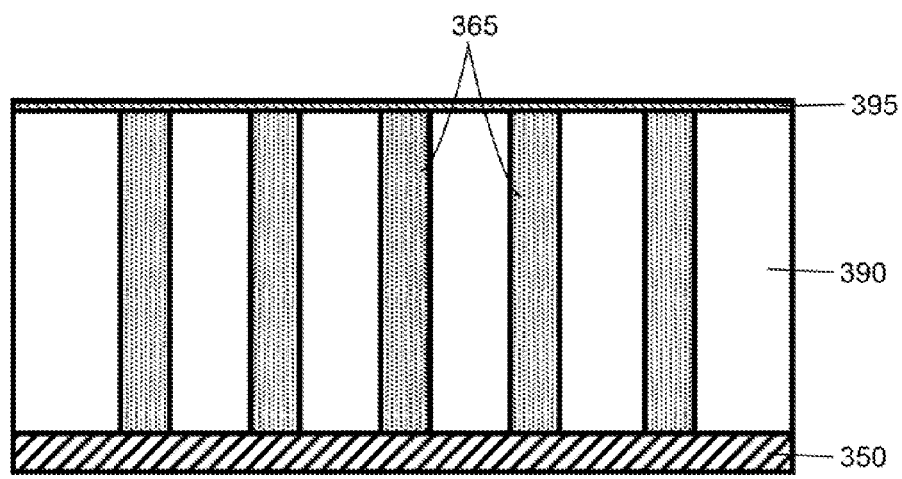

A fifth step in the fabrication of the radiation detector is the filling of these etched features with germanium. Low temperature deposition is achieved by low pressure chemical vapour deposition, with the smaller features being filled using an atomic layer deposition process. These processes use germanium tetrahydride as a precursor material, which decomposes to germanium and hydrogen. The result of this process is shown in FIG. 3f, in which the germanium 390 surrounds the formed nanostructure 365. Excess germanium deposition, over the level of the silicon dioxide, is then etched back using a sulphur hexafluoride $SF_6$ and oxygen plasma. The result of this process is illustrated in FIG. 3g. Finally, a top metal contact 395 layer is applied, resulting in the detector element illustrated in FIG. 3h.

Final fabrication of radiation detectors is achieved by dicing the wafer into individual detectors. Wire bonding to appropriate detection electronics are formed, and the detectors packaged as desired, for example into hand-held radiation detectors.

An alternative, second method of fabrication of a radiation detector in accordance with an embodiment of the invention will now be described. In the accordance with the second method, germanium nanorods are directly etched from germanium, rather than etching a 'mould' structure beforehand, as in the case of the first method described above, which is then filled with germanium in order to create the germanium nanorods. Various stages in the manufacture of the second embodiment are illustrated in FIGS. 5a to 5d.

The starting point for fabrication of a radiation detector in accordance with the second method is a commercially available pixelated CMOS ASIC multiplex wafer, as is the case with the first method described above with reference to FIGS. 3a to 3g. Such a wafer is illustrated in cross-section in FIG. 5a, in which like reference numerals, incremented by two hundred, are used to refer to like parts as illustrated in FIG. 3a.

Figure 5A:
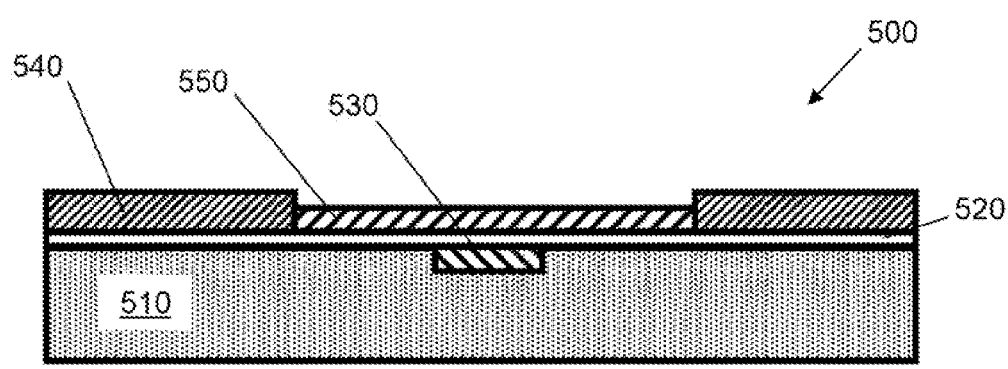
FIGS. 5a to 5d illustrate a series of stages in the manufacture of the radiation detector illustrated in FIG. 1, applying a method in accordance with a second embodiment of the invention.
Figure 5B:
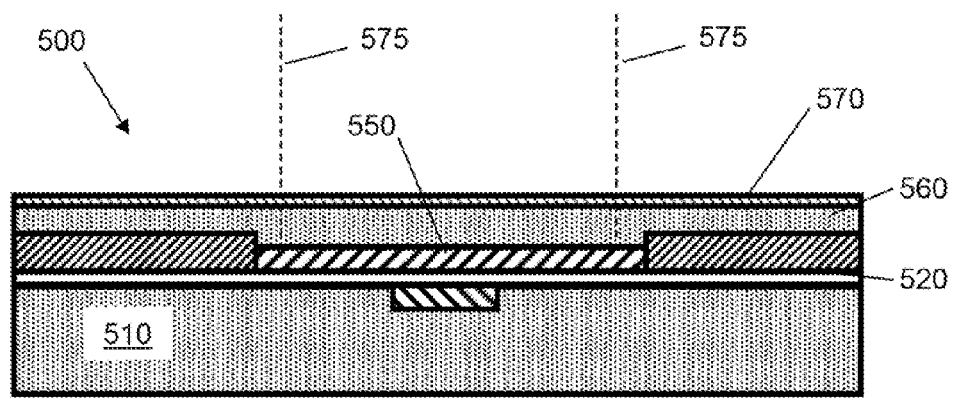

A cross-sectional view of the result of a first stage in the fabrication of the radiation detector is shown in FIG. 5b, in which like parts as illustrated in FIG. 5a are given like reference numerals. The first stage comprises the deposition of a layer of germanium 560 over the wafer. The layer is approximately 900 μm deep. A mask 570, preferably of aluminium as in the first embodiment, is then applied, and a mask pattern imprinted over the pixel areas indicated generally by the dotted lines in FIG. 5b.

Figure 5C:
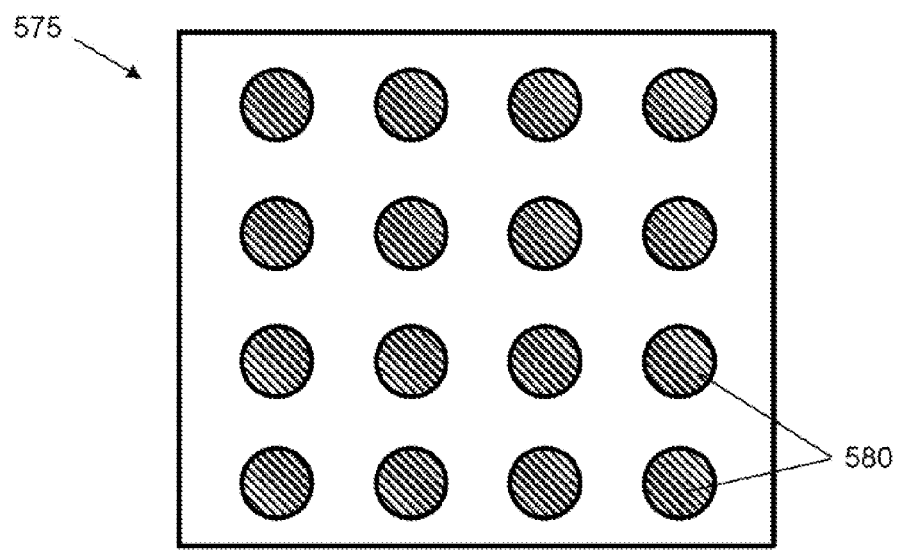

The pattern applied to the mask material is illustrated in plan view in FIG. 5c. The pattern comprises a number of generally circular regions, such as those labelled with reference numeral 580, of approximately 50 nm in diameter, with the remainder of the mask material etched away. In effect, the mask pattern for the second embodiment of the invention is a 'negative' image of the mask pattern for the first method described above.

A second stage in the fabrication of the radiation detector is the etching of the germanium layer, in the unmasked regions, to form the nanorods. The etching process is performed in two steps. In a first step, the process gas supplied to the etching chamber is hydrogen bromide (at 85 sccm), combined with a mixture of helium and oxygen (at 15 sccm, with the helium containing 5% oxygen). An inductively coupled plasma reactive ion etching process, using apparatus as described above with reference to FIG. 4, is used. The process is naturally anisotropic as a result of the application of an accelerating electric field to the etch volume, which ensures continuous (and directed) bombardment of the wafer. In this case, the coil power is set at approximately 900 W, whilst the substrate power is set at 120 W. The pressure in the chamber is controlled to be approximately 20 mTorr. The etch product $GeBr_4$ is volatile, but heavy, and can therefore escape, whilst $GeBr_2$, which may form on the side walls, reacts with the oxygen present to form germanium oxide $GeO_2$, passivating the side walls and ensuring that the required anisotropic etch profile is obtained.

This etch process is at first fast, but as the etched trenches become deeper, and, correspondingly, the aspect ratios of the features being formed becomes larger, becomes slower. The slowdown in the etch process is a result of the heavy etchant species used, and the resulting heavy etch product. These relatively heavy molecules are slow both to reach the bottom surface of the trenches, and to escape from the trenches. This first process is continued to an etch depth of at least 20 μm, and in the present embodiment to an etch depth of approximately 30 μm. The trenches formed during the first etch process function to collimate the etch reactants during the second etch process described below, and it can therefore be advantageous to form trenches that are as deep as practically possible, given the etch speed, in order to increase the precision of the collimation. In other embodiments, the first process may be continued to a depth of between 30 μm and 50 μm, or greater.

A second etch process is then applied, using different etchant species. The combination of HBr with a mixture of helium and oxygen used as the process gas in the first step of the etching stage is replaced with nitrogen fluoride $NF_3$. The fluoride ions formed from the dissociation of $NF_3$ are significantly lighter than the bromide ions that are the active etch species in the first process. The fluoride ions are therefore able to reach the trench bottoms significantly more quickly than the heavier bromide ions. In addition, the etch product, $GeF_4$, is also significantly lighter than $GeBr_4$, is more volatile, and therefore escapes from the etched features more quickly. Thus the process is no longer limited by the slow diffusion of bromide ions or compounds, and becomes much quicker. $NF_3$ is supplied at 50 sccm, with the coil power set at 1100 W, and the substrate power set at 200 W.

The pressure in the chamber is controlled to be at approximately 8 mTorr, the relatively low pressure being selected in order to facilitate escape of the etch product from the deep trench features being formed.

During the second step of the etching stage, passivation of the side walls is not continued. However, continued passivation throughout this second step is not required, because of the collimation effect provided by the upper parts of the etched features which are already passivated (by a coating of $GeO_2$) as a result of the first step of the etching process. The combination of the two different etching processes results in a process that is sufficiently fast to be practical, which would not be the case were hydrogen bromide etching to be used exclusively, but that still enables high aspect ratio features such as nanorods to be etched. Notably, the process can still be achieved efficiently through use of an etching vessel with a sufficient number of channels for process gas input. One channel can be used for HBr, one for $NF_3$, and one for a mixture of helium and oxygen. Alternatively, the supply to one channel can be changed to $NF_3$ between the first and second stages of the etch process.

Figure 5D:
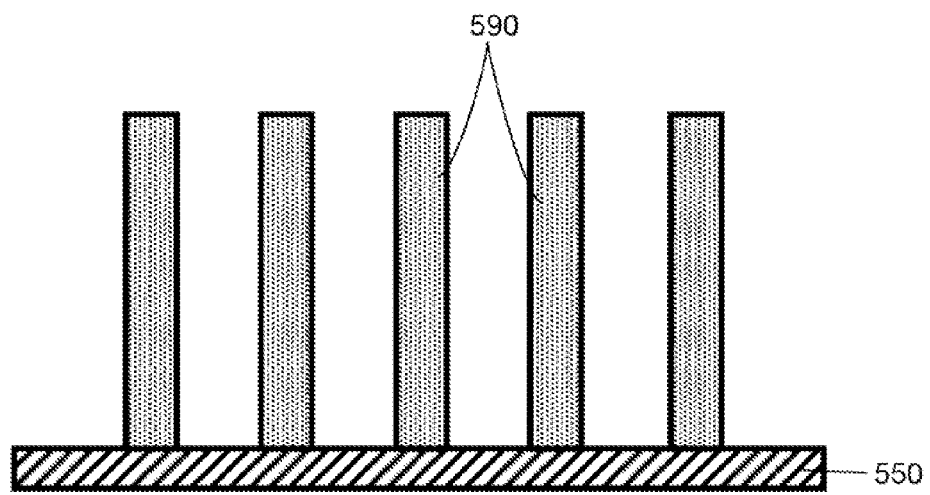

The result of the second stage of fabrication of a radiation detector in accordance with the second method is shown in cross-section in FIG. 5d, in which the nanorods 590 can be seen. The remaining mask material 570 is then etched away, and the spaces between the nanorods filled with silicon dioxide. Any overfill silicon dioxide is etched back, and an upper electrode deposited on the upper surface of the structure. As described above in respect of the first method of manufacturing the radiation detector, the wafer can then be diced to form individual detectors. The detectors can then be connected to signal processing electronics and packaged as may be appropriate for a particular application, using techniques known in the art. For example, it may be desired to manufacture a handheld radiation detection device.

Whilst a number of specific embodiments of the invention have been described in the above, it is to be noted that variations and modifications are possible without departing from the scope of the present invention which is defined in the accompanying claims. Those skilled in the art will appreciate that, notwithstanding the advantageous properties of germanium as described above, it would be possible to select materials other than germanium to provide the sensing material of the above-described radiation detector. For example, a carborane material could be used instead of germanium.

Finally, it should be clearly understood that any feature described above in relation to any one embodiment may be used alone, or in combination with other features described, and may also be used in combination with one or more features of any other of the embodiments, or any combination of any other of the embodiments.

The invention claimed is:

1. A method of manufacturing a radiation detector comprising:
   (i) providing a layer of a first material on a substrate;
   (ii) selectively removing the first material from parts of the layer; and
   (iii) filling the removed parts of the layer with a second material;
   wherein one of the first or the second material comprises germanium, and wherein (ii) and (iii) in combination result in an array of elongate nanostructures, and
   wherein selectively removing the first material comprises:
   applying a mask material to define the material to be removed from the layer;
   anisotropically removing material from the layer using a first plasma etching process during which a passivating material is formed on side walls of features being etched; and
   subsequent to the first etching process, using a second plasma etching process to deepen the features created by the first etching process, the second etching process including use of an etchant species to anisotropically remove further material from the features etched by the first etching process;
   wherein the etchant species responsible for the removal of material from the features during the second etching process is collimated by those parts of the features formed by the first etching process, such that no further passivation is required during the second etching process.

2. The method as claimed in claim 1, wherein the elongate nanostructures are formed of germanium.

3. The method as claimed in claim 1, wherein the first material comprises germanium.

4. The method as claimed in claim 1, wherein the first and second etching processes are inductively coupled plasma reactive ion etching processes.

5. The method as claimed in claim 1, wherein process gas used for the first etching process is a combination of hydrogen bromide, helium and oxygen, and wherein process gas used for the second etching process is nitrogen fluoride.

6. A method of making deep high aspect ratio features in a substrate, the method comprising:
   applying a mask material to the substrate to define material to be removed;
   anisotropically removing material from the substrate using a first plasma etching process, during which a passivating material is formed on side walls of features being etched;
   subsequently, using a second plasma etching process including use of an etchant species to deepen the features created by the first etching process;
   wherein the etchant species responsible for the removal of material from the features during the second etching process is collimated by parts of the features formed by the first etching process, such that no further passivation is required during the second etching process;
   wherein the features created by the first and second etching processes comprise elongate nanostructures, and the dimensions of the elongate nanostructures are selected such that the bandgap of the elongate nanostructures is suitable for the room temperature detection of x-ray and gamma radiation and wherein the features created by the first or second etching processes are formed of germanium.

7. The method as claimed in claim 6, wherein the features created by the first and second etching processes are formed of germanium.

8. The method as claimed in claim 6, wherein the bandgap of the features created by the first and second etching processes is between 0.9 eV and 1.1 eV.

9. The method as claimed in claim 6, further comprising at least one of: removing remaining mask material;
   filling spaces between the features created by the first and second etching processes with a material to electrically isolate adjacent features;
   etching back the isolation material to expose a lower electrode; and depositing an upper electrode on an upper surface of the resulting structure.

10. The method as claimed in claim 6, further comprising at least one of: dicing the substrate into a plurality of detectors; and connecting the detectors to signal processing electronics.

* * * * *